United States Patent
Sherman et al.

(10) Patent No.: US 10,954,418 B2
(45) Date of Patent: Mar. 23, 2021

(54) OPTICALLY CLEAR HIGH REFRACTIVE INDEX ADHESIVES

(71) Applicant: 3M INNOVATIVE PROPERTIES COMPANY, St. Paul, MN (US)

(72) Inventors: Audrey A. Sherman, Woodbury, MN (US); Margot A. Branigan, Roseville, MN (US); Craig E. Hamer, Woodbury, MN (US); Ross E. Behling, Woodbury, MN (US); Thomas E. Augustine, Hager City, WI (US); Karl E. Benson, St. Paul, MN (US)

(73) Assignee: 3M Innovation Properties Company, St. Paul, MN (US)

(*) Notice: Subject to any disclaimer, the term of this patent is extended or adjusted under 35 U.S.C. 154(b) by 102 days.

(21) Appl. No.: 15/100,371

(22) PCT Filed: Nov. 25, 2014

(86) PCT No.: PCT/US2014/067354
§ 371 (c)(1),
(2) Date: May 31, 2016

(87) PCT Pub. No.: WO2015/084643
PCT Pub. Date: Jun. 11, 2015

(65) Prior Publication Data
US 2016/0298005 A1   Oct. 13, 2016

Related U.S. Application Data

(60) Provisional application No. 61/911,658, filed on Dec. 4, 2013.

(51) Int. Cl.
| | | |
|---|---|---|
| *C09J 133/14* | (2006.01) | |
| *C09J 133/06* | (2006.01) | |
| *C09J 4/06* | (2006.01) | |
| *C08F 220/18* | (2006.01) | |
| *C23C 14/02* | (2006.01) | |
| *C08J 11/08* | (2006.01) | |
| *C08L 33/02* | (2006.01) | |
| *C09J 7/38* | (2018.01) | |

(52) U.S. Cl.
CPC ......... *C09J 133/06* (2013.01); *C08F 220/18* (2013.01); *C09J 4/06* (2013.01); *C09J 133/14* (2013.01); *C23C 14/02* (2013.01); *C08J 11/08* (2013.01); *C08L 33/02* (2013.01); *C08L 2201/10* (2013.01); *C09J 7/38* (2018.01); *C09J 7/381* (2018.01)

(58) Field of Classification Search
CPC . C09J 133/06; C09J 133/14; C09J 7/38; C09J 7/381; C09J 7/383; C09J 7/385; C09J 7/387; C09J 11/08; C09J 201/02; C08L 33/02; C08L 2201/01
See application file for complete search history.

(56) References Cited

U.S. PATENT DOCUMENTS

| | | | |
|---|---|---|---|
| 4,310,584 A * | 1/1982 | Cooper | B32B 7/02 428/212 |
| 4,619,979 A | 10/1986 | Kotnour | |
| 4,737,559 A | 4/1988 | Kellen | |
| 4,833,179 A | 5/1989 | Young | |
| 4,843,134 A | 6/1989 | Kotnour | |
| 5,637,646 A | 6/1997 | Ellis | |
| 5,753,768 A | 5/1998 | Ellis | |
| 6,294,249 B1 * | 9/2001 | Hamer | B29B 13/022 428/345 |
| 6,928,794 B2 | 8/2005 | Hamer | |
| 7,255,920 B2 | 8/2007 | Everaerts | |
| 7,294,861 B2 | 11/2007 | Schardt | |
| 7,335,425 B2 | 2/2008 | Olson | |
| 7,927,703 B2 | 4/2011 | Xia | |
| 2001/0025083 A1 * | 9/2001 | Stark | C09J 201/02 525/222 |
| 2004/0091729 A1 * | 5/2004 | Olson | C08F 220/18 428/523 |
| 2004/0202879 A1 * | 10/2004 | Xia | B32B 7/12 428/500 |
| 2009/0208739 A1 * | 8/2009 | Husemann | B32B 17/10018 428/354 |
| 2010/0048804 A1 | 2/2010 | Determan | |
| 2011/0039099 A1 | 2/2011 | Sherman | |
| 2011/0300296 A1 | 12/2011 | Sherman | |
| 2012/0276317 A1 * | 11/2012 | Tse | C09J 7/00 428/40.2 |

FOREIGN PATENT DOCUMENTS

| | | |
|---|---|---|
| CN | 1028882001 | 1/2013 |
| EP | 0312228 | 4/1989 |
| EP | 1674481 | 6/2006 |
| WO | WO 1997-33945 | 9/1997 |
| WO | WO 2008-116033 | 9/2008 |
| WO | WO 2014-093141 | 6/2014 |
| WO | WO 2014-105584 | 7/2014 |

OTHER PUBLICATIONS

International Search Report for PCT International Application No. PCT/US2014/067354, dated Jul. 13, 2015, 3pgs.

* cited by examiner

*Primary Examiner* — Ling Siu Choi
*Assistant Examiner* — David L Miller
(74) *Attorney, Agent, or Firm* — Jeffrey M. Olofson

(57) ABSTRACT

Optically clear adhesive compositions contain an elastomeric polymer and a low molecular weight polymeric additive. The elastomeric polymer and the low molecular weight polymeric additive form an acid-base interaction. The refractive index of the adhesive composition is higher than the refractive index of the elastomeric polymer. The adhesive composition may also contain additional domains of liquids, polymers, additives or particles that have a higher refractive index than the elastomeric polymer.

11 Claims, No Drawings

OPTICALLY CLEAR HIGH REFRACTIVE INDEX ADHESIVES

CROSS REFERENCE TO RELATED APPLICATIONS

This application is a national stage filing under 35 U.S.C. 371 of PCT/US2014/067354, filed Nov. 25, 2014, which claims the benefit of U.S. Provisional Application No. 61/911,658, filed Dec. 4, 2013, the disclosure of which is incorporated by reference in its/their entirety herein.

FIELD OF THE DISCLOSURE

The present disclosure relates generally to adhesives, specifically to adhesives that are optically clear, hot melt processable and that have a high refractive index.

BACKGROUND

Adhesives have been used for a variety of marking, holding, protecting, sealing and masking purposes. Adhesive tapes generally comprise a backing, or substrate, and an adhesive. One type of adhesive, a pressure sensitive adhesive (PSA) is particularly preferred for many applications.

PSAs are well known to one of ordinary skill in the art to possess certain properties at room temperature including the following: (1) aggressive and permanent tack, (2) adherence with no more than finger pressure, (3) sufficient ability to hold onto an adherend, and (4) sufficient cohesive strength to be removed cleanly from the adherend. Materials that have been found to function well as PSAs are polymers designed and formulated to exhibit the requisite viscoelastic properties resulting in a desired balance of tack, peel adhesion, and shear strength. The most commonly used polymers for preparation of PSAs are natural rubber, synthetic rubbers (e.g., styrene/butadiene copolymers (SBR) and styrene/isoprene/styrene (SIS) block copolymers), and various (meth) acrylate (e.g., acrylate and methacrylate) copolymers. With the exception of several (meth)acrylates, which are inherently tacky, these polymers are typically blended with appropriate tackifying resins to render them pressure sensitive.

Among the advances that have been made in the adhesive area are adhesive that are prepared in packages or shells, and adhesives with high refractive indices. Adhesives have been prepared in packages and shells as described for example in U.S. Pat. Nos. 6,294,249 and 6,928,794 (Hamer et al.). Additionally, pressure sensitive adhesives with high refractive indices are described in U.S. Pat. No. 7,335,425 (Olson et al.).

SUMMARY

Described herein are adhesive compositions, typically pressure sensitive adhesive compositions, which have an array of desirable properties, such as being optically clear, hot melt processable and having a high refractive index. Also disclosed are methods of preparing such adhesives. The adhesive compositions comprise a first elastomeric polymer, and a low molecular weight polymeric additive. The first elastomeric polymer and the low molecular weight polymeric additive form an acid-base interaction, meaning that if the first elastomeric polymer has a plurality of acidic functional groups, then the low molecular weight polymeric additive has a plurality of basic functional groups. Conversely, if the first elastomeric polymer has a plurality of basic functional groups, then the low molecular weight polymeric additive has a plurality of acidic functional groups. The refractive index of the adhesive composition is higher than the refractive index of the first elastomeric polymer. The adhesive composition may be optically transparent or optically clear and may contain additional domains that have a higher refractive index than the first elastomeric polymer. The domains may comprise liquids, polymers, additives or particles.

Also disclosed are methods for preparing adhesive compositions, the method comprising providing a first elastomeric polymer, providing a low molecular weight polymeric additive, mixing the first elastomeric polymer with the low molecular weight polymeric additive to form a mixture, and contacting the mixture to the surface of a substrate to form an adhesive composition layer on the substrate. The first elastomeric polymer and the low molecular weight polymeric additive form an acid-base interaction as described above, and the refractive index of the adhesive composition is higher than the refractive index of the first elastomeric polymer.

In some embodiments, the mixing of the first elastomeric polymer with the low molecular weight polymeric additive is carried out in one or more solvents. In other embodiments, the mixing is carried out by hot melt mixing. When the mixing of the first elastomeric polymer with the low molecular weight polymeric additive is carried out by hot melt mixing, the first elastomeric polymer may be contained in a thermoplastic polymeric shell.

DETAILED DESCRIPTION

The use of adhesives, especially pressure sensitive adhesives, in areas such as the medical, electronic, automotive, energy, and optical industries is increasing. The requirements of these industries place additional demands upon the pressure sensitive adhesive beyond the traditional properties of tack, peel adhesion and shear holding power. New classes of materials are desirable to meet the increasingly demanding performance requirements for pressure sensitive adhesives. Among the performance requirements for new classes of pressure sensitive adhesives are optical properties such as being optically transparent or optically clear.

One problem with the use of adhesives in optical articles is that many of the optical substrates, have a higher refractive index than the adhesives. Examples of optical substrates include, for example, optical films and rigid optical substrates such as glass plates and transparent polymeric plates. The difference in refractive index causes light to be refracted at the adhesive-substrate interface. This refraction can be detrimental since it causes a loss of clarity and inhibits the transmission of light.

One solution to this problem is to use optical substrates with lower refractive indices to better match the refractive index of the adhesive. This solution is typically impractical since it would require changing the materials used to prepare the optical substrates. For example, replacing a glass window or viewing screen with a window or viewing screen made from a lower refractive index polymeric material is prohibitively expensive and would require massive changes throughout the optical industry.

Therefore, a more practical solution is to change the refractive index of the adhesive, raising it to better match the refractive index of the optical substrates. While much more practical, this approach also has difficulties. One must modify the adhesives to increase the refractive index while at the same time retaining the desirable properties of the adhesives, such as adhesive strength (both peel strength and shear holding power) and tack. In addition, many of the monomers useful to form polymers with high refractive index, such as halogenated monomers, especially monomers substituted with bromine atoms, and monomers with aromatic groups such as biphenyl groups, tend to be more expensive than conventional monomers. Additionally, these monomers form polymers with higher values of Tg (glass transition temperature), making it more difficult to form polymers with a sufficiently low Tg to form a pressure sensitive adhesive. Thus an adhesive formulator wishing to generate a pressure sensitive adhesive with a refractive index to better match the refractive index of optical substrates, has a number of conflicting attributes to simultaneously juggle. For example, for (meth)acrylate copolymer adhesives, if one substitutes one or more alkyl (meth) acrylate monomers with a brominated (meth)acrylate monomer, one needs to be aware of the effect that these monomers have on the Tg, the cost, and the processing conditions that can be used to prepare the copolymer. Therefore it would be desirable to be able to raise the refractive index of an adhesive composition, without having to change the elastomeric copolymer component of the composition.

Regarding processing conditions, often pressure sensitive adhesives are provided as solutions or solvent-borne mixtures, often solutions or solvent-borne mixtures containing large amounts of solvents. Upon coating or dispensing, the solvent needs to be removed to produce an adhesive layer. Often the solvent is removed through the use of elevated temperature processing such as heating with an oven. Such solvent removal steps can add cost to the formed articles because solvent removal requires additional steps. Not only are additional steps involved, often these steps require specialized care, precautions and equipment because the solvents are volatile and generally flammable. In addition, shipment of adhesive solutions adds additional expense because of the added weight of solvent and may require special shipment precautions due to the presence of solvent. Environmental concerns are also an issue with solvent borne adhesive systems, since, even with the use of solvent reclamation equipment, solvent release to the environment is likely.

Therefore, 100% solids adhesive systems have been developed. Among these 100% solids systems are hot melt processable adhesives, including hot melt processable pressure sensitive adhesives. Difficulties have arisen when solvent processing has been replaced by hot melt processing. Often it is difficult to replicate the properties of solvent delivered adhesive layers with hot melt delivered systems, particularly with adhesives that are optically transparent or optically clear.

Additionally, because 100% solids pressure sensitive adhesives are tacky polymeric compositions, handling of these compositions, especially on a large scale can be problematic. A wide variety of techniques have been developed to deal with these handling issues. One such technique is the preparation of pressure sensitive adhesive polymers or compositions within a polymeric shell. These enclosed pressure sensitive adhesives can then be handled without contacting the tacky polymeric composition. The entire shell can then be hot melt processed, for example in an extruder or similar mixing device, and coated to form a pressure sensitive adhesive layer. This layer contains not only the pressure sensitive adhesive polymer or composition, but also the remnants of the shell material. Often the remnants of the shell material comprise polymeric particles. In systems where the pressure sensitive adhesive is not visible (such as with many tape constructions) or where the pressure sensitive adhesive need not have optical properties, the presence of polymeric particles is typically not an issue. However, if the particles are large enough to scatter visible light, that is to say, larger than the wavelengths of light associated with the visible portion of the spectrum, and the polymeric particles are of a different refractive index than the pressure sensitive adhesive polymer or composition, the adhesive layer can scatter visible light. This scattering has the detrimental result of decreased visible light transmission and increased haze. The need for adhesive layers with increasingly demanding optical properties, such as high visible light transmission and low haze, makes the desirable process of preparing of pressure sensitive adhesive polymers or compositions within a polymeric shell and then hot melt processing and coating these compositions to form an adhesive layer, appear to be unlikely to succeed.

Thus, it would be desirable to be able to raise the refractive index of an adhesive composition, without having to change the elastomeric copolymer component of the composition, and it is also desirable to be able to process these adhesive compositions in a variety of different ways including solvent-based processing and hot melt-based processing. In this disclosure, additives are described that can be blended with a wide range of elastomeric copolymers to prepare adhesive compositions with refractive indices higher than the refractive index of the elastomeric copolymer itself. These additives are able to raise the refractive index of the adhesive composition without detrimentally affecting the adhesive properties (peel strength, shear holding power, and tack, for example), or the optical clarity of the adhesive composition.

Additionally disclosed herein are adhesive compositions and techniques developed to permit the use of the desirable preparation of pressure sensitive adhesive polymers or compositions within a polymeric shell and then hot melt processing and coating these shells to form adhesive layers with desirable optical properties, such as high visible light transmission and/or low haze. The combination of an elastomeric polymer and a low molecular weight polymeric additive generate a pressure sensitive adhesive matrix that has a higher refractive index than the elastomeric polymer has by itself. These relatively high refractive pressure sensitive adhesives have a higher refractive index than conventional (meth)acrylate-based pressure sensitive adhesives, and are designed to be similar to the refractive index of the polymers used in the shell materials. Thus, even if the remnants of the shells are present as particles that are larger than the wavelength of visible light, the reduction of the mismatch of refractive indices between the (meth)acrylate based pressure sensitive adhesive and the shell remnant particles permits the generation of adhesive layers with desirable optical properties, such as high visible light transmission and/or low haze.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

The term "adhesive" as used herein refers to polymeric compositions useful to adhere together two adherends. Examples of adhesives are heat activated adhesives and pressure sensitive adhesives.

Heat activated adhesives are non-tacky at room temperature but become tacky and capable of bonding to a substrate at elevated temperatures. These adhesives usually have a $T_g$ (glass transition temperature) or melting point ($T_m$) above room temperature. When the temperature is elevated above the $T_g$ or $T_m$, the storage modulus usually decreases and the adhesive becomes tacky.

Pressure sensitive adhesive compositions are well known to those of ordinary skill in the art to possess properties including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as pressure sensitive adhesives are polymers designed and formulated to exhibit the requisite viscoelastic properties resulting in a desired balance of tack, peel adhesion, and shear holding power. Obtaining the proper balance of properties is not a simple process.

The terms "glass transition temperature" and "$T_g$" are used interchangeably. Typically $T_g$ values are measure using Differential Scanning calorimetry (DSC) unless otherwise noted.

The term "room temperature" refers to ambient temperature, generally 20-22° C., unless otherwise noted.

The term "(meth)acrylate" refers to monomeric acrylic or methacrylic esters of alcohols. Acrylate and methacrylate monomers or oligomers are referred to collectively herein as "(meth)acrylates". Polymers described as "(meth)acrylate-based" are polymers or copolymers prepared primarily (greater than 50% by weight) from (meth)acrylate monomers and may include additional ethylenically unsaturated monomers.

Unless otherwise indicated, "optically transparent" refers to an article, film or adhesive composition that has a high light transmittance over at least a portion of the visible light spectrum (about 400 to about 700 nm).

Unless otherwise indicated, "optically clear" refers to an adhesive or article that has a high light transmittance over at least a portion of the visible light spectrum (about 400 to about 700 nm), and that exhibits low haze.

The term "wavelength of visible light" as used herein encompasses the wavelengths of the light spectrum that constitutes visible light (about 400 to about 700 nm).

Refractive index is defined herein as the absolute refractive index of a material (e.g., a monomer or the polymerized product thereof) which is understood to be the ratio of the speed of electromagnetic radiation in free space to the speed of the radiation in that material, with the radiation being of sodium yellow light at a wavelength of about 583.9 nanometers (nm). The refractive index can be measured using known methods and is generally measured using an Abbe Refractometer.

The term "adjacent" as used herein when referring to two layers means that the two layers are in proximity with one another with no intervening open space between them. They may be in direct contact with one another (e.g. laminated together) or there may be intervening layers.

The term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl.

The term "aryl" refers to a monovalent group that is aromatic and carbocyclic. The aryl can have one to five rings that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

The term "alkylene" refers to a divalent group that is a radical of an alkane. The alkylene can be straight-chained, branched, cyclic, or combinations thereof. The alkylene often has 1 to 20 carbon atoms. In some embodiments, the alkylene contains 1 to 18, 1 to 12, 1 to 10, 1 to 8, 1 to 6, or 1 to 4 carbon atoms. The radical centers of the alkylene can be on the same carbon atom (i.e., an alkylidene) or on different carbon atoms.

The term "arylene" refers to a divalent group that is carbocyclic and aromatic. The group has one to five rings that are connected, fused, or combinations thereof. The other rings can be aromatic, non-aromatic, or combinations thereof. In some embodiments, the arylene group has up to 5 rings, up to 4 rings, up to 3 rings, up to 2 rings, or one aromatic ring. For example, the arylene group can be phenylene.

The terms "free radically polymerizable" and "ethylenically unsaturated" are used interchangeably and refer to a reactive group which contains a carbon-carbon double bond which is able to be polymerized via a free radical polymerization mechanism.

Disclosed herein are adhesive compositions comprising a first elastomeric polymer and a low molecular weight polymeric additive that has a relatively high refractive index. The first elastomeric polymer and the low molecular weight polymeric additive form an acid-base interaction. By this it is meant that the first elastomeric polymer and the low molecular weight polymeric additive each contain either an acid or base functionality such that when the two components are mixed they form an acid-base interaction, which for the purposes of this disclosure comprises crosslinking. The acid-base interaction that is present between the polymeric components may be described as a Lewis acid-base type interaction. Lewis acid-base interactions require that one chemical component be an electron acceptor (acid) and the other an electron donor (base). The electron donor provides an unshared pair of electrons and the electron acceptor furnishes an orbital system that can accommodate the additional unshared pair of electrons. The following general equation describes the Lewis acid-base interaction:

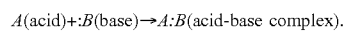

$A$(acid)+:$B$(base)→$A$:$B$(acid-base complex).

This crosslinking by the formation of an acid-base complex is not chemical, i.e. there is no chemical bond formed between polymeric components, but is physical. These physical crosslinks have the advantage of being reversible. This permits the mixture of components to be more readily processed through either solvent-borne or solventless methods. In solution, or in the molten state, the physical crosslinks are very weak or nonexistent, but upon cooling or drying, the physical crosslinks form spontaneously and cause the mixture of components to form a crosslinked mass. This physical crosslinking is described in US Patent Publication No. 2004/0202879 (Xia et al.).

The refractive index of the adhesive composition is higher than the refractive index of the first elastomeric polymer. In other words, the addition of the low molecular weight additive causes the refractive index of the adhesive composition to be higher than it would be if the additive were not present. This effect is in contrast with conventional processes used to raise the refractive index of an adhesive composition by raising the refractive index of the elastomeric polymer. The adhesive composition may be a heat activated adhesive or a pressure sensitive adhesive, typically a pressure sensitive adhesive.

In some embodiments of this disclosure, the adhesive composition is optically clear. Optically clear compositions generally have visible light transmission of greater than 90%, and a haze of less than 5%. In some embodiments, the optically clear compositions may have a visible light transmission of greater than 95% and/or a haze value of less than 2%.

Visible light transmission and haze can be measured using well understood optical techniques. For example, visible light transmission and haze can be measured with a BYK Gardner Spectrophotometer using the techniques described in the test method ASTM D1003. The optical properties of the adhesive composition, such as whether the adhesive composition is optically transparent or optically clear, can depend on wide variety of parameters. The desired optically properties can be different for different applications and intended uses, and thus, a variety of different adhesive compositions with different optical properties can be suitable. For example, for some applications, optically transparent adhesive compositions are suitable, whereas for other applications, optically clear adhesive compositions are necessary.

In some embodiments, the adhesive composition further comprises domains having a higher refractive index than the first elastomeric polymer, wherein the domains comprise liquids, polymers, additives or particles. These domains do not include the low molecular weight polymeric additive. Examples of suitable domain components include, for example, thermoplastic particles, liquid or solid plasticizers, antioxidants, HALS (hindered amine light stabilizers), electron beam synergists, additional elastomeric or pressure sensitive adhesive polymers, and the like. In embodiments in which the domains comprise particles, at least some of the particles have an average particle size that is larger than the average wavelength of visible light. Typically the particles are thermoplastic polymer particles of polyethylene, ethylene vinyl acetate, ethylene methyl acrylate, ethylene acrylic acid, ethylene acrylic acid ionomers, polypropylene, acrylic polymers, polyphenylene ether, polyphenylene sulfide, acrylonitrile-butadiene-styrene copolymers, polyurethanes, and mixtures and blends thereof. The particles result from the hot melt processing of a thermoplastic shell containing an elastomeric polymer, as will be described in more detail below.

A wide variety of elastomeric polymers are suitable in the adhesive compositions of this disclosure. Examples of particularly suitable elastomeric polymers are those which are useful as optically transparent or optically clear pressure sensitive adhesives. The elastomeric polymers may themselves be pressure sensitive adhesives, in other words, the elastomeric polymers may be inherently tacky, or they can be used in conjunction with tackifying agents to form pressure sensitive adhesives. The elastomeric polymers comprise either acidic or basic functional groups, such that these groups are able to form an acid-base interaction with corresponding groups on the low molecular weight polymer additive that is described below. Suitable elastomeric polymers include, for example, natural rubbers, synthetic rubbers, styrene block copolymers, (meth)acrylic block copolymers, polyvinyl ethers, polyolefins, and poly(meth)acrylates. The terms (meth)acrylate and (meth)acrylic include both acrylates and methacrylates.

One particularly suitable class of elastomeric polymers are (meth)acrylate-based elastomeric copolymers. These copolymers may comprise either acidic or basic copolymers. In many embodiments the (meth)acrylate-based pressure sensitive adhesive is an acidic copolymer. Generally, as the proportion of acidic monomers used in preparing the acidic copolymer increases, cohesive strength of the resulting adhesive increases. The proportion of acidic monomers is usually adjusted depending on a variety of factors, such as the desired Tg and molecular weight of the elastomeric polymer, and the level of basic functionality present on the low molecular weight polymer additive.

To achieve pressure sensitive adhesive characteristics, the corresponding copolymer can be tailored to have a resultant glass transition temperature (Tg) of less than about 20° C., more typically less than about 0° C. Particularly suitable (meth)acrylate copolymers typically are derived from monomers comprising about 40% by weight to about 98% by weight, often at least 70% by weight, or at least 85% by weight, or even about 90% by weight, of at least one alkyl (meth)acrylate monomer that, as a homopolymer, has a Tg of less than about 0° C.

Examples of such alkyl (meth)acrylate monomers are those in which the alkyl groups comprise from about 4 carbon atoms to about 12 carbon atoms and include, but are not limited to, n-butyl acrylate, 2-ethylhexyl acrylate, isooctyl acrylate, isononyl acrylate, isodecyl, acrylate, and mixtures thereof. Optionally, other vinyl monomers and alkyl (meth)acrylate monomers which, as homopolymers, have a Tg greater than 0° C., such as methyl acrylate, methyl methacrylate, isobornyl acrylate, vinyl acetate, styrene, and the like, may be utilized in conjunction with one or more of the low Tg alkyl (meth)acrylate monomers and copolymerizable basic or acidic monomers, provided that the Tg of the resultant (meth)acrylate copolymer is less than about 20° C., more typically less than about 0° C.

In some embodiments, it is desirable to use (meth)acrylate monomers that are free of alkoxy groups. Alkoxy groups are understood by those skilled in the art.

Additionally, the elastomeric copolymer can comprise a basic copolymer, such as a basic (meth)acrylate copolymer. When used, basic (meth)acrylate copolymers typically are derived from basic monomers comprising about 2% by weight to about 50% by weight, or about 5% by weight to about 30% by weight, of a copolymerizable basic monomer.

When used to form the pressure sensitive adhesive matrix, acidic (meth)acrylate copolymers typically are derived from acidic monomers comprising about 2% by weight to about 30% by weight, or about 2% by weight to about 15% by weight, of a copolymerizable acidic monomer.

In certain embodiments, the poly(meth)acrylic elastomeric polymer is derived from between about 1 and about 20 weight percent of acrylic acid and between about 99 and about 80 weight percent of at least one of isooctyl acrylate, 2-ethyl-hexyl acrylate or n-butyl acrylate composition. In some embodiments, the elastomeric polymer is derived from between about 2 and about 10 weight percent acrylic acid and between about 90 and about 98 weight percent of at least one of isooctyl acrylate, 2-ethyl-hexyl acrylate or n-butyl acrylate composition.

Another useful class of optically clear (meth) acrylate-based elastomeric polymers are those which are (meth) acrylic block copolymers. Such copolymers may contain only (meth)acrylate monomers or may contain other co-monomers such as styrenes. Examples of such pressure sensitive adhesives are described, for example in U.S. Pat. No. 7,255,920 (Everaerts et al.).

The elastomeric polymers can be prepared through the use of standard copolymerization techniques, such as hot melt and solvent-borne techniques. If prepared by a solvent-borne technique, the elastomeric polymer can be isolated from the solvent by drying, or if the adhesive composition is to be prepared in solvent, the solvent-borne elastomeric polymer can be used as a solution. Similarly, if the elastomeric polymer is prepared by hot melt techniques, the elastomeric polymer can be isolated and permitted to cool prior to blending to form the adhesive composition, or the elastomeric polymer can be used in the molten state and blended with the other components of the adhesive composition.

In some embodiments the elastomeric polymer is prepared in a thermoplastic shell. These packaged compositions may be elastomeric polymers or they may themselves be adhesive compositions. The packaged elastomeric polymers or adhesive compositions comprise polymerized pre-adhesive mixture comprising a (meth)acrylate-based copolymers and may also comprise a variety of different additives.

The packaged elastomeric polymer or adhesive composition is prepared by polymerizing a polymerizable pre-adhesive mixture. The polymerizable pre-adhesive mixture comprises a mixture of free radically polymerizable co-monomers, and a polymerization initiator.

The pre-adhesive mixture may comprise a wide variety of free radically polymerizable co-monomers These co-monomers include alkyl (meth)acrylate monomers, polar (meth) acrylate and ethylenically unsaturated monomers, and other ethylenically unsaturated monomers.

Useful alkyl (meth)acrylate monomers may be present at ranges up to 95 parts by weight per 100 parts by weight total monomer. More typically the alkyl (meth)acrylate are present at a level of 70-95 parts by weight per 100 parts by weight total monomers. Useful monomers include at least one monomer selected from the group consisting of a monomeric acrylic or methacrylic acid ester of a non-tertiary alkyl alcohol, the alkyl group of which comprises from about 1 to about 12 carbon atoms, more typically from about 4 to about 8 carbon atoms, and mixtures thereof.

Suitable alkyl (meth)acrylate monomers include, but are not limited to, those selected from the group consisting of the esters of acrylic acid or methacrylic acid with non-tertiary alkyl alcohols such as 1-butanol, 1-pentanol, 2-pentanol, 3-pentanol, 2-methyl-1-butanol, 1-methyl-1-butanol, 1-methyl-1-pentanol, 2-methyl-1-pentanol, 3-methyl-1-pentanol, 2-ethyl-1-butanol, 2-ethyl-1-hexanol, 3,5,5-trimethyl-1-hexanol, 3-heptanol, 2-octanol, 1-decanol, 1-dodecanol, and the like, and mixtures thereof. Such monomeric acrylic or methacrylic esters are known in the art and are commercially available.

Additionally, the pre-adhesive mixture may also contain copolymerizable polar monomers, where the polar monomers comprise acid-functional monomers or base-functional monomers. Polar monomers can be used to increase the cohesive strength of the adhesive, as well as to supply the acidic or basic functionality to provide the acid-base interaction with the low molecular weight polymer additive. Generally, polar monomers are typically present at ranges from about 1 to about 12 parts by weight per 100 parts by weight total monomer, more typically from about 2 to about 8 parts by weight per 100 parts by weight total monomer. Useful acidic polar monomers include, but are not limited to, those selected from the group consisting of ethylenically unsaturated carboxylic acids, ethylenically unsaturated sulfonic acids, and ethylenically unsaturated phosphoric acids, and mixtures thereof. Examples of such compounds include, but are not limited to, those selected from the group consisting of acrylic acid, methacrylic acid, itaconic acid, fumaric acid, crotonic acid, citraconic acid, maleic acid, B-carboxyethyl acrylate, sulfoethyl methacrylate, and the like, and mixtures thereof. Useful base-functional copolymerizable polar monomers include, but are not limited to, acrylamides, N,N-dialkyl substituted acrylamides, N-vinyl lactams, and N,N-dialkylaminoalkyl acrylates, and mixtures thereof. Illustrative examples include, but are not limited to, those selected from the group consisting of N,N-dimethyl acrylamide, N,N-dimethyl methacrylamide, N,N-diethyl acrylamide, N,N-diethyl methacrylamide, N,N-dimethylaminoethyl methacrylate, N,N-dimethylaminopropyl methacrylate, N,N-dimethylaminoethyl acrylate, N,N-dimethylaminopropyl acrylate, and the like, and mixtures thereof.

Particularly useful polar monomers include acrylic acid, methacrylic acid, itaconic acid, acrylamide, methacrylamide, acrylonitrile, methacrylonitrile, and mixtures thereof.

Other ethylenically unsaturated monomers, such as vinyl monomers, may be added to improve performance, reduce cost, etc. in quantities which do not adversely affect the desired optical or adhesive properties of the adhesive. When used, vinyl monomers useful in the adhesive copolymer include vinyl esters (e.g., vinyl acetate and vinyl propionate), styrene, substituted styrene (e.g., α-methyl styrene), and mixtures thereof. If used, such vinyl monomers are generally used at 0 to 5 parts by weight, more typically 1 to 5 parts by weight, based on 100 parts by weight total monomer.

Besides the above listed monomers, the pre-adhesive mixture may also comprise optional additional additives such as a crosslinker or a chain transfer agent. In order to increase cohesive strength of the (meth)acrylate-based copolymer, it may be crosslinked. Because the packaged adhesive composition is typically hot melt processed, crosslinking is generally carried out after hot melt processing with cross-linking agents that are not affected by hot melt processing. Therefore, crosslinkers in this context refer to materials that copolymerize with the (meth)acrylate monomers described above, and then are subsequently activated to create crosslinks. In this way, the polymerized packaged adhesive composition is not crosslinked and therefore is hot melt processable, but upon hot melt processing and coating, the adhesive can be crosslinked.

Typically, the crosslinker is a chemical crosslinker that generates free radicals to affect the crosslinking reaction. One suitable class of chemical crosslinkers is a photosensitive crosslinker which is activated by high intensity ultraviolet (UV) light. Two common photosensitive crosslinkers used for (meth)acrylate-based copolymers are benzophenone and copolymerizable aromatic ketone monomers as described in U.S. Pat. No. 4,737,559. Typically, such crosslinkers are used in amounts of about 0.05 to 5.0 parts by weight, more typically 0.05 to 1.0 parts by weight of crosslinker per 100 parts by weight of total monomers present in the pre-adhesive mixture.

Additionally, a photocrosslinking agent can be blended with the pre-adhesive mixture. This type of photocrosslinker does not polymerize into the (meth)acrylate based copolymer, but remains in the package and is not activated by the hot melt processing. An example of such a photocrosslinker, which can be blended with the (meth)acrylate-based copolymer and activated by UV light, is a triazine, for example, 2,4-bis(trichloromethyl)-6-(4-methoxy-phenyl)-s-triazine. These crosslinkers, whether incorporated into the (meth) acrylate-based copolymer or blended with the copolymer, are activated by UV light generated from artificial sources such as medium pressure mercury lamps or a UV blacklight.

The pre-adhesive mixture may also comprise a chain transfer agent. Examples of useful chain transfer agents include, but are not limited to, those selected from the group consisting of carbon tetrabromide, mercaptans, alcohols, and mixtures thereof.

The pre-adhesive mixture may also comprise an initiator to initiate free radical polymerization. Typically, the initiator is a thermal initiator. Thermal initiators useful in the present disclosure include, but are not limited to azo, peroxide, persulfate, and redox initiators. In some embodiments, it may be desirable not to include an initiator and effect initiation through the use of, for example, gamma radiation. In these embodiments, the packaged pre-adhesive mixture is exposed to gamma radiation as described, for example, in pending application U.S. Ser. No. 61/737,221, filed Dec. 14, 2012.

Suitable azo initiators include, but are not limited to, 2,2'-azobis(2,4-dimethylvaleronitrile) (VAZO 52); 2,2'-azobisisobutyronitrile) (VAZO 64); 2,2'-azobis-2-methylbutyronitrile (VAZO 67); and (1,1'-azobis(1-cyclohexanecarbonitrile) (VAZO 88), all of which are available from DuPont Chemicals, and 2,2'-azobis(methyl isobutyrate) (V-601) and 2,2'-azobis(2-amidinopropane) dihydrochloride (V-50) available from Wako Chemicals. Also suitable is 2,2'-azobis (4-methoxy-2,4-dimethylvaleronitrile), formerly available from DuPont Chemicals as VAZO 33.

Suitable peroxide initiators include, but are not limited to, benzoyl peroxide, acetyl peroxide, lauroyl peroxide, decanoyl peroxide, dicetyl peroxydicarbonate, di(4-t-butylcyclohexyl) peroxydicarbonate (PERKADOX 16S, available from AkzoNobel Polymer Chemicals), di(2-ethylhexyl) peroxydicarbonate, t-butylperoxypivalate (LUPERSOL 11, available from Atochem), t-butylperoxy-2-ethylhexanoate (TRIGONOX 21-050, available from AkzoNobel Polymer Chemicals, Inc.), and dicumyl peroxide.

Suitable persulfate initiators include, but are not limited to, potassium persulfate, sodium persulfate, and ammonium persulfate.

Suitable redox (oxidation-reduction) initiators include, but are not limited to, combinations of the above persulfate initiators with reducing agents such as sodium metabisulfite and sodium bisulfite; systems based on organic peroxides and tertiary amines (for example, benzoyl peroxide plus dimethylaniline); and systems based on organic hydroperoxides and transition metals, for example, cumene hydroperoxide plus cobalt naphthenate.

Other initiators include, but are not limited to pinacols, such as tetraphenyl 1,1,2,2-ethanediol.

The thermal initiator may be used in an amount from about 0.01 to about 5.0 parts by weight per 100 parts of total monomer, more typically from 0.025 to 2 parts by weight per 100 parts of total monomer.

The adhesive composition may also comprise a variety of additives that are not copolymerizable materials as long as the additives do not interfere with the desired optical and adhesive properties of the adhesive composition. Crosslinking additives have already been described above. Examples of other suitable additives include tackifiers, plasticizers, and other performance enhancement additives. Additionally, for optical applications, tackifiers, plastizicers and other additives should have low color; i.e. a Gardner value of greater than 3, more typically greater than 1.

Examples of useful tackifiers include, but are not limited to, rosin, rosin derivatives, polyterpene resins, coumaroneindene resins, and the like. Plasticizers which may be added to the adhesive may be selected from a wide variety of commercially available materials.

Representative plasticizers include polyoxyethylene aryl ether, dialkyl adipate, 2-ethylhexyl diphenyl phosphate, t-butylphenyl diphenyl phosphate, di-(2-ethylhexyl) adipate, toluenesulfonamide, dipropylene glycol dibenzoate, polyethylene glycol dibenzoate, polyoxypropylene aryl ether, dibutoxyethoxyethyl formal, and dibutoxyethoxyethyl adipate. When used, tackifiers are typically added in an amount not to exceed about 50 parts by weight per 100 parts by weight copolymer, and plasticizer may be added in an amount up to about 50 parts by weight per 100 parts by weight copolymer.

It is desirable that any added tackifier and/or plasticizer has a refractive index of at least 1.50, so that incorporation does not reduce the refractive index of the ultimately formed adhesive composition. Useful high refractive index plasticizers include aromatic phosphate esters, phtalates, benzoic ethers, aromatic sulfonamide, and some rosins. The phosphate esters and phtalates are particularly suitable. Exemplary plasticizer include diethylene glycol dibenzoate (1.5424 n25/D), 4-(tert-butyl)phenyl diphenyl phosphate (1.555 n25/D), trimethylphenyl phosphate (1.5545 n25/D), triphenyl phosphate (1.5575 n25/D), phenylmethyl benzoate (1.56 n25/D), diethylene glycol dibenzoate (1.5424 n25/D), butyl benzyl phthalate (1.537 n25/D), methyl ester of rosin (1.531 n20/D), alkyl benzyl phthalate (1.526 n25/D), butyl (phenylsulfonyl)amine (1.525 n20/D), benzyl phthalate (1.518 n25/D), trimethyl trimellitate (1.523 (n20/D), and 2-ethylhexyl diphenyl phosphate (1.51 (n20/D).

Other additives can be added in order to enhance the performance of the adhesive compositions. Examples of such performance enhancing additives include leveling agents, ultraviolet light absorbers, hindered amine light stabilizers (HALS), oxygen inhibitors, wetting agents, rheology modifiers, defoamers, biocides, dyes, pigments, and the like. All of these additives and the use thereof are well known in the art. It is understood that any of these compounds can be used so long as they do not deleteriously affect the adhesive and optical properties.

Among the particularly useful additives are UV absorbers and hindered amine light stabilizers (HALS). UV absorbers and hindered amine light stabilizers act to diminish the harmful effects of UV radiation on the adhesive composition and thereby enhance the weatherability, or resistance to cracking, yellowing and delamination of coatings prepared from the adhesive compositions. A suitable HALS is bis(1, 2,2,6,6-pentamethyl-4-piperidinyl) [3,5-bis(1,1-dimethylethyl-4-hydroxyphenyl)methyl]butylpropanedioate, available as TINUVIN 144, from CIBA-GEIGY Corporation, Hawthorne, N.Y.

The following UV absorbers and combinations thereof in concentrations of less than 5 parts by weight based on the total monomer composition, may produce desirable results, with concentrations in the range of 1-5 parts by weight based on the total monomer composition being particularly suitable: bis(1,2,2,6,6-pentamethyl-4-piperidinyl)(3,5-bis(1,1- dimethylethyl 1-4-hydroxyphenyl)methyl) butylpropanedioate, 2-ethylhexyl-2-cyano-3,3'-diphenylacrylate, 2-hydroxyl-4-n-octoxybenzophenone, 2-(2'-hydroxy-5'-methylphenyl)benzotriazole, poly(oxy-1,2-ethanediyl), alpha-(3-(3-(2H-benzotriazol-2-yl)-5-(1,1-dimethylethyl)-4-hydroxylphenyl)-1-oxopropyl)-omega-hydroxy, and UVINUL D-50 and UVINUL MS-40, sold by BASF Wyandotte Inc., Parsippany, N.J.

Additionally, the adhesive composition may also contain particles, as long as the particles do not interfere with the desired optical properties of the adhesive composition. Particularly suitable are particles that do not scatter visible light but absorb light of one wavelength and re-emit the light at a different wavelength. Examples of such particles include the phosphor particles described in U.S. Pat. No. 7,294,861 (Schardt et al.).

The packaged adhesive composition also comprises a packaging material. The packaging material completely surrounds the polymerized pre-adhesive mixture and any optional additives. The packaging material is a thermoplastic material that generally melts at or below the processing temperature of the polymerized pre-adhesive mixture (in other words, the temperature at which the polymerized pre-adhesive mixture flows). The packaging material generally has a melting point of 200° C. or less, or 170° C. or less. In some embodiments the melting point ranges from 90° C. to 150° C. The packaging material may be a flexible thermoplastic polymeric film. The flexible thermoplastic polymeric films are prepared from thermoplastic materials. Suitable thermoplastic materials include polyethylene, and ethylene copolymers such as ethylene/polyolefin copolymers and ethylene/vinyl copolymers such as ethylene vinyl acetate (EVA), ethylene methyl acrylate (EMA), ethylene acrylic acid (EAA), EAA ionomers, and polypropylene, and other thermoplastic materials such as acrylics, polyphenylene ether, polyphenylene sulfide, acrylonitrile-butadiene-styrene copolymer (ABS), polyurethanes, and others know to those skilled in the art. Blends of thermoplastic materials may also be used. Particularly suitable thermoplastic materials are polyethylene and EVA.

The flexible thermoplastic films range in thickness from 0.01 mm to 0.25 mm. The thicknesses typically range from 0.025 mm to 0.127 mm to obtain films that have good strength during processing while being thin enough to heat seal quickly and minimize the amount of film material used.

The packaging materials may contain plasticizers, stabilizers, dyes, perfumes, fillers, slip agents, antiblock agents, flame retardants, anti-static agents, microwave susceptors, thermally conductive particles, electrically conductive particles, and/or other materials to increase the flexibility, handleability, visibility, or other useful property of the film, as long as they do not adversely affect the desired properties of the adhesive composition.

The amount of packaging material depends upon the type of material and the desired end properties. The amount of packaging material typically ranges from 0.5 to 20 weight % based on the total weight of the adhesive composition and the packaging material. Typically, the packaging material is between 2 and 15 weight %, and more typically between 3 and 5 weight %.

In addition to the elastomeric polymer component described above, the adhesive composition also comprises a low molecular weight polymeric additive. This low molecular weight polymeric additive has a relatively high refractive index, and thus blending the low molecular weight additive with the elastomeric polymer component produces an adhesive composition with a higher refractive index than the refractive index of the elastomeric polymer component.

The low molecular weight polymeric additive has either an acidic or basic functionality, such that the low molecular weight additive forms an acid-base interaction with a corresponding functionality on the elastomeric polymer, as was described above.

A wide variety of low molecular weight polymeric additives are suitable. By low molecular weight it is meant that the number average additive polymer molecular weight ($M_n$) is lower than the number average molecular weight of the elastomeric polymer. Typically the additive polymer molecular weight is much less than the molecular weight of the elastomeric polymer. In some embodiments, the number average molecular weight of the polymeric additive is 50,000 to 500,000 Daltons, more typically 60,000 to 400,000 Daltons, 70,000 to 300,000 Daltons, or even 80,000 to 250,000 Daltons.

The low molecular weight polymeric additives are copolymers. Typically, the copolymers are (meth)acrylate copolymers comprising, one or more high refractive index monomers, an acid or basic functional monomer, and one or more alkyl(meth)acrylate monomers. A number of factors affect the desired ratio and identities of the specific monomers chosen to prepare the low molecular weight polymeric additive. Among these factors are the composition and properties of the elastomer polymer or polymers with which the additive is to be blended, the properties desired for the low molecular weight additive (such as refractive index, Tg, and optical properties), the method desired for processing the adhesive composition (such as hot melt or solvent-borne), the availability of monomers, and the cost.

A number of high refractive index monomers that are copolymerizable with (meth)acrylate monomers are suitable, such as aromatic monomers which have a relatively high refractive index. Typically the aromatic monomer has a homopolymer glass transition temperature ($T_g$) at or below 70° C., or even at or below 50° C. The level of aromatic monomer and the identity of the particular aromatic monomer or monomers used depends at least in part upon the desired properties of the (meth)acrylate-based copolymer. Because the aromatic monomers tend to have higher homopolymer glass transition temperatures than conventional (meth)acrylate monomers used in the preparation of adhesive polymers, some care should be exercized in the choice and amount of aromatic monomers used in the preparation of the (meth)acrylate-based copolymer. If the (meth)acrylate-based copolymer is to have pressure sensitive adhesive properties, typically pressure sensitive adhesive copolymers have a glass transition temperature of 20° C. or less, more typically 0° C. or less. If however, the (meth)acrylate-based copolymer is to have heat activated adhesive properties, the copolymers can have a higher glass transition temperature.

Examples of suitable aromatic monomers include those described in U.S. Pat. No. 7,335,425 (Olson et al.) and can be described by the general Formula 1 below:

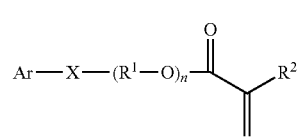

Formula 1 wherein
Ar is an aromatic group which is unsubstituted or substituted with a substituent selected from the group consisting of $Br_y$ and $(R^3)_z$, wherein y represents the number of bromine substituents attached to the aromatic group and is an integer from 0 to 3, and $R^3$ is a straight or branched alkyl of 2 to 12 carbons, and z represents the number of $R^3$ substituents attached to the aromatic ring and is an integer from 0 to 1, provided that both y and z are not zero; X is oxygen, sulfur or $-NR^4-$, wherein $R^4$ is H or a $C_1$-$C_4$ alkyl; n is 0 to 3; $R^1$ is an unsubstituted straight or branched alkyl linking group of 2 to 12 carbons; and $R^2$ is either H or $CH_3$.

In some embodiments of aromatic monomers, X is oxygen. Within this embodiment of aromatic monomers, a group of monomers includes those of Formula 2 wherein Ar is naphthyl:

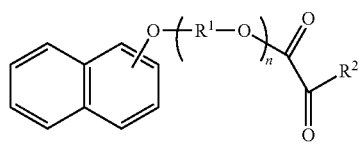

Formula 2 and $R^1$, $R^2$, and n are as defined above. The naphthyl group is unsubstituted or substituted as described above. Within the group of naphthyl aromatic monomers, another group are those wherein Ar is 1-napthyl or 2-napthyl.

Within the embodiment of aromatic monomers where X is oxygen, another group of monomers includes those of Formula 3 wherein Ar is phenyl:

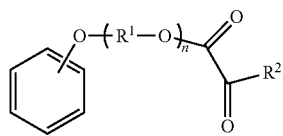

Formula 3 and $R^1$, $R^2$, and n are as defined above. The phenyl group is unsubstituted or substituted as described above. Within the substituted group of phenyl aromatic monomers, generally the phenyl is dibromo substituted. Within the bromine substituted group, the phenyl monomers may also be 2-alkyl substituted or 4-alkyl substituted.

In other embodiments of aromatic monomers, X is sulfur. Within this embodiment of aromatic monomers, a group of monomers includes those of Formula 4 wherein Ar is naphthyl:

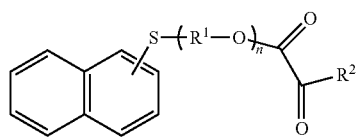

Formula 4 and $R^1$, $R^2$, and n are as defined above. The naphthyl group is unsubstituted or substituted as described above. Within the group of naphthyl aromatic monomers, an additional group is that wherein Ar is 1-napthyl or 2-napthyl.

Within the embodiment of aromatic monomers where X is sulfur, another group of monomers includes those of Formula 5 wherein Ar is phenyl:

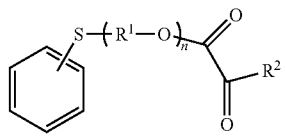

Formula 5 and $R^1$, $R^2$, and n are as defined above. The phenyl group is unsubstituted or substituted as described above. Within this group of phenyl aromatic monomers, generally the phenyl is dibromo substituted. In another group, the phenyl monomers may be 2-alkyl substituted or 4-alkyl substituted.

Some specific examples of such aromatic monomers suitable in the present disclosure include, but are not limited to, 6-(4,6-dibromo-2-isopropyl phenoxy)-1-hexyl acrylate, 6-(4,6-dibromo-2-sec-butyl phenoxy)-1-hexyl acrylate, 2,6-dibromo-4-nonylphenyl acrylate, 2,6-dibromo-4-dodecyl phenyl acrylate, 2-(1-naphthyloxy)-1-ethyl acrylate, 2-(2-naphthyloxy)-1-ethyl acrylate, 6-(1-naphthyloxy)-1-hexyl acrylate, 6-(2-naphthyloxy)-1-hexyl acrylate, 8-(1-naphthyloxy)-1-octyl acrylate, 8-(2-naphthyloxy)-1-octyl acrylate, 2-phenylthio-1-ethyl acrylate, and phenoxy ethyl acrylate.

One particularly suitable class of aromatic monomers are those described in US Patent Publication No. 2010/0048804 (Determan et al.). These aromatic monomers are represented by the general Formula 6 below:

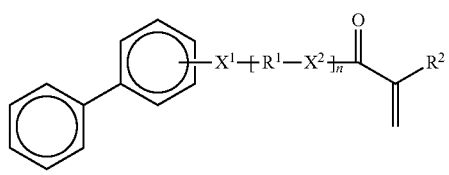

Formula 6 wherein
$X^1$ and $X^2$ are each independently $-O-$, $-S-$, or $-NR^4-$, wherein $R^4$ is H or $C_1$-$C_4$ alkyl, in some embodiments, $X^1$ and $X^2$ are each $-O-$;
$R^1$ is an alkylene of 1 to 8 carbons, and may contain one or more ether oxygen atoms and one or more pendent hydroxy groups;
n is integer of from 0 to 3; and
$R^2$ is either H or $CH_3$.

In certain embodiments of the aromatic monomer of Formula 6, $R^1$ is an alkylene of 1 to 8 carbons; i.e. $-C_aH_{2a}-$, where a is 1 to 8. In other embodiments $R^1$ may contain one or more catenary ether oxygen atoms; e.g. $-C_bH_{2b}-O-C_cH_{2c}-$, where b and c are at least 1 and b+c is 2 to 8. In another embodiment $R^1$ may contain a pendent hydroxy group; e.g. $-C_bH_{2b}-CH(OH)-C_cH_{2c}-$, where b and c are at least 1 and b+c is 2 to 8. If desired, the biphenyl group may be brominated to increase the refractive index of the resulting adhesive. However such bromine substitution may also increase the Tg of the adhesive. The biphenyl ring may have zero to two bromine atoms, and are typically substituted ortho- and/or para- to the $X^1$ group. Particularly desirable biphenyl monomers are those that have homopolymer glass transition temperatures at or below 70° C.

Useful acidic monomers include, but are not limited to, those selected from ethylenically unsaturated carboxylic acids, ethylenically unsaturated sulfonic acids, ethylenically unsaturated phosphonic acids, and mixtures thereof. Examples of such compounds include those selected from acrylic acid, methacrylic acid, itaconic acid, fumaric acid, crotonic acid, citraconic acid, maleic acid, oleic acid, B-carboxyethyl acrylate, 2-sulfoethyl methacrylate, styrene sulfonic acid, 2-acrylamido-2-methylpropane sulfonic acid, vinyl phosphonic acid, and the like, and mixtures thereof. Due to their availability, acidic monomers, if used, are typically the ethylenically unsaturated carboxylic acids. When even stronger acids are desired, acidic monomers include the ethylenically unsaturated sulfonic acids and ethylenically unsaturated phosphonic acids.

Exemplary basic monomers include N,N-dimethylaminopropyl methacrylamide (DMAPMAm); N,N-diethylaminopropyl methacrylamide (DEAPMAm); N,N-dimethylaminoethyl acrylate (DMAEA); N,N-diethylaminoethyl acrylate (DEAEA); N,N-dimethylaminopropyl acrylate (DMAPA); N,N-diethylaminopropyl acrylate (DEAPA); N,N-dimethylaminoethyl methacrylate (DMAEMA); N,N-diethylaminoethyl methacrylate (DEAEMA); N,N-dimethylaminoethyl acrylamide (DMAEAm); N,N-dimethylaminoethyl methacrylamide (DMAEMAm); N,N-diethylaminoethyl acrylamide (DEAEAm); N,N-diethylaminoethyl methacrylamide (DEAEMAm); N,N-dimethylaminoethyl vinyl ether (DMAEVE); N,N-diethylaminoethyl vinyl ether (DEAEVE); and mixtures thereof. Other useful basic monomers include vinylpyridine, vinylimidazole, tertiary amino-functionalized styrene (e.g., 4-(N,N-dimethylamino)-styrene (DMAS), 4-(N,N-diethylamino)-styrene (DEAS)), N-vinyl pyrrolidone, N-vinyl caprolactam, acrylonitrile, N-vinyl formamide, (meth)acrylamide, and mixtures thereof.

(Meth)acrylate monomers are monofunctional unsaturated monomers that are (meth)acrylate esters of non-tertiary alkyl alcohols, the alkyl groups of which comprise from about 1 to about 20, or even 1 to about 18 carbon atoms. The alkyl groups can also include heteroatoms (e.g., oxygen or sulfur). Examples of suitable (meth)acrylate monomers include, but are not limited to, benzyl methacrylate, n-butyl acrylate, n-butyl methacrylate, cyclohexyl acrylate, cyclohexyl methacrylate, decyl acrylate, 2-ethoxy ethyl acrylate, 2-ethoxy ethyl methacrylate, ethyl acrylate, 2-ethylhexyl acrylate, ethyl methacrylate, n-hexadecyl acrylate, n-hexadecyl methacrylate, hexyl acrylate, hydroxy-ethyl methacrylate, hydroxy ethyl acrylate, isoamyl acrylate, isobornyl acrylate, isobornyl methacrylate, isobutyl acrylate, isodecyl acrylate, isodecyl methacrylate, isononyl acrylate, isooctyl acrylate, isooctyl methacrylate, isotridecyl acrylate, lauryl acrylate, lauryl methacrylate, 2-methoxy ethyl acrylate, methyl acrylate, methyl methacrylate, 2-methyl butyl acrylate, 4-methyl-2-pentyl acrylate, 1-methylcyclohexyl methacrylate, 2-methylcyclohexyl methacrylate, 3-methylcyclohexyl methacrylate, 4-methylcyclohexyl. methacrylate, octadecyl acrylate, octadecyl methacrylate, n-octyl acrylate, n-octyl methacrylate, 2-phenoxy ethyl methacrylate, 2-phenoxy ethyl acrylate, propyl acrylate, propyl methacrylate, n-tetradecyl acrylate, n-tetradecyl methacrylate, and mixtures thereof.

In this disclosure, the low molecular weight polymeric additive typically comprises at least one aromatic monomer in an amount of at least 5 parts by weight per 100 parts by weight of total monomer. In some embodiments, the low molecular weight polymeric additive comprises at least one aromatic monomer in an amount of at least 10 parts by weight per 100 parts by weight of total monomer, at least 20 parts by weight per 100 parts by weight of total monomer, at least 25 parts by weight per 100 parts by weight of total monomer, at least 30 parts by weight per 100 parts by weight of total monomer, at least 35 parts by weight per 100 parts by weight of total monomer, at least 40 parts by weight per 100 parts by weight of total monomer, at least 45 parts by weight per 100 parts by weight of total monomer, at least 50 parts by weight per 100 parts by weight of total monomer, or even at least 70 parts by weight per 100 parts by weight of total monomer. More typically, the low molecular weight additive is present in an amount of from at least 20 parts by weight per 100 parts by weight of total monomer, to 50 parts by weight per 100 parts by weight of total monomer.

Besides the aromatic monomer, the low molecular weight polymeric additive also comprises from about 1 to about 10 parts by weight per 100 parts by weight of total monomer of an acid or basic functional monomer, more typically about 3 to about 8 parts by weight per 100 parts total monomer, most typically about 5 parts by weight per 100 parts of total monomer. Because the elastomeric polymer frequently contains acid functional monomers, the low molecular weight additive polymer often contains basic functional monomers.

The remainder of the monomers present in the low molecular weight polymeric additive typically are alkyl (meth)acrylate monomers. For example, if the low molecular weight polymeric additive includes 25 parts by weight aromatic monomer, and 5 parts by weight basic monomer, it would include 70 parts by weight alkyl (meth)acrylate monomer. Similarly, if the low molecular weight polymeric additive includes 50 parts by weight aromatic monomer, and 5 parts by weight basic monomer, it would include 45 parts by weight alkyl (meth)acrylate monomer.

In addition to these monomers, other co-polymerizable monomers can be included. Examples of such monomers include vinyl ethers, vinyl esters, styrene, substituted styrenes, and ethylenically unsaturated macromonomers such as styrene macromers, for example.

Polymers useful as the low molecular weight polymeric additive can be prepared by any conventional free radical polymerization method, including solution, radiation, bulk, electron beam (initiator free) polymerization, dispersion, emulsion, and suspension processes. In one solution polymerization method, the monomers, along with a suitable inert organic solvent, are charged into a four-neck reaction vessel that is equipped with a stirrer, a thermometer, a condenser, an addition funnel, and a thermowatch. A concentrated thermal free radical initiator solution is added to the addition funnel. The whole reaction vessel, addition funnel, and their contents are then purged with nitrogen to create an inert atmosphere. Once purged, the solution within the vessel is heated to an appropriate temperature to activate the free radical initiator to be added, the initiator is added, and the mixture is stirred during the course of the reaction. A 98% to 99% conversion can typically be obtained in about 20 hours.

Bulk polymerization methods, such as the continuous free radical polymerization method described by Kotnour et al. in U.S. Pat. Nos. 4,619,979 and 4,843,134; the essentially adiabatic polymerization methods using a batch reactor described by Ellis in U.S. Pat. No. 5,637,646; suspension polymerization processes described by Young et al. in U.S. Pat. No. 4,833,179; and, the methods described for polymerizing packaged pre-adhesive compositions described by Hamer et al. in PCT Publication No. WO 97/33945 may also be utilized to prepare the polymers.

Suitable thermal free radical initiators which may be utilized include, but are not limited to, those selected from azo compounds, such as 2,2'-azobis(isobutyronitrile); hydroperoxides, such as tert-butyl hydroperoxide; and, peroxides, such as benzoyl peroxide and cyclohexanone peroxide. Photoinitiators which are useful according to this disclosure include, but are not limited to, those selected from benzoin ethers, such as benzoin methyl ether or benzoin isopropyl ether; substituted benzoin ethers, such as anisole methyl ether; substituted acetophenones, such as 2,2-diethoxyacetophenone and 2,2-dimethoxy-2-phenyl acetophenone; substituted alpha-ketols, such as 2-methyl-2-hydroxy propiophenone; aromatic sulfonyl chlorides, such as 2-naphthalene sulfonyl chloride; and, photoactive oximes, such as 1-phenyl-1,2-propanedione-2-(ethoxycarbonyl)oxime. For both thermal- and radiation-induced polymerizations, the initiator is present in an amount of about 0.05% to about 5.0% by weight based upon the total weight of the monomers. Additionally, the polymerization can be initiated by exposure to electron beam irradiation, in which case an initiator is not required.

While the low molecular weight polymeric additive may be prepared by solventless methods, it is often desirable that solvents are used in preparing the low molecular weight polymeric additive. Suitable solvent, if desired, may be any liquid which is sufficiently inert to the reactants and product such that it will not otherwise adversely affect the reaction. Such solvents include ethyl acetate, acetone, methyl ethyl ketones, heptane, toluene and mixtures thereof. If used, the amount of solvent is generally about 30-80% by weight based on the total weight of the reactants (monomer and initiator) and solvent. The solvent may be optionally removed from the polymers prior to blending or mixing with the other components in the adhesive composition.

Chain transfer agents can also be utilized when polymerizing the polymers described herein to control the molecular weight of the polymers. Suitable chain transfer agents include halogenated hydrocarbons (e.g., carbon tetrabromide) and sulfur compounds (e.g., lauryl mercaptan, butyl mercaptan, ethanethiol, and 2-mercaptoether).

The amount of chain transfer agent that is useful depends upon the desired molecular weight and the type of chain transfer agent. Organic solvents (e.g., toluene, isopropanol, and ethyl acetate) can also be used as chain transfer agents, but they generally are not as active as, for example, sulfur compounds. The chain transfer agent is typically used in amounts from about 0.001 parts to about 10 parts; more often, 0.01 to about 0.5 parts; and specifically from about 0.02 parts to about 0.20 parts based on total weight of the monomers.

In addition to the elastomeric polymer and the low molecular weight polymeric additive described above, the adhesive composition may also comprise a wide range of other optional additives, provided the additives cause no adverse effects to the desired properties, such as optical clarity and environmental stability over time. For example, compatible tackifiers and/or plasticizers may be added. As was discussed above, these additives may be within a shell along with the elastomeric polymer, or the additives can be added separately. The use of such tack-modifiers is common in the art, as is described in the Handbook of Pressure Sensitive Adhesive Technology, edited by Donatas Satas (1982). Examples of useful tackifiers include, but are not limited to, rosin, rosin derivatives, polyterpene resins, coumarone-indene resins, and the like. Plasticizers which may be added to the adhesive of this disclosure may be selected from a wide variety of commercially available materials. Representative plasticizers include polyoxyethylene aryl ether, dialkyl adipate, 2-ethylhexyl diphenyl phosphate, t-butylphenyl diphenyl phosphate, 2-ethylhexyl adipate, toluenesulfonamide. dipropylene glycol dibenzoate, polyethylene glycol dibenzoate, polyoxypropylene aryl ether, dibutoxyethoxyethyl formal, and dibutoxyethoxyethyl adipate. UV stabilizers as known in the art may also be added.

To increase the cohesive strength of the adhesive composition, the adhesive composition may optionally be crosslinked. As mentioned above, the elastomeric polymer may itself be crosslinked when it is formed, but crosslinking in this context refers to crosslinking after the entire adhesive composition is formed. This crosslinking is in addition to the acid-base interaction between the elastomeric polymer and the low molecular weight polymeric additive which has been described above. Typically the crosslinkers can be added after polymerization and activated to crosslink the polymer. Classes of crosslinkers are discussed in greater detail below. Crosslinking may also be achieved using high energy electromagnetic radiation such as gamma or e-beam radiation without the use of crosslinking additives.

Two types of crosslinking additives are commonly used to effect crosslinking after polymerization. The first crosslinking additive is a thermal crosslinking additive such as a multifunctional aziridine. One example is 1,1'-(1,3-phenylene dicarbonyl)-bis-(2-methylaziridine) (Bisamide). Such chemical crosslinkers can be added into the solvent-based PSA after polymerization and activated by heat during oven drying of the coated adhesive. Isocyanate and epoxy crosslinkers can also be used.

In another embodiment, chemical crosslinkers that rely upon free radicals to carry out the crosslinking reaction may be employed. Reagents such as, for example, peroxides serve as a source of free radicals. When heated sufficiently, these precursors will generate free radicals which bring about a crosslinking reaction of the polymer. A common free radical generating reagent is benzoyl peroxide. Free radical generators are required only in small quantities, but generally require higher temperatures to complete a crosslinking reaction than those required for the bisamide reagent.

The second type of chemical crosslinker is a photosensitive crosslinker which is activated by high intensity ultraviolet (UV) light. Two common photosensitive crosslinkers used are benzophenone and copolymerizable aromatic ketone monomers as described in U.S. Pat. No. 4,737,559. Another photocrosslinker, which can be post-added to the solution composition and activated by UV light is a triazine, for example, 2,4-bis(trichloromethyl)-6-(4-methoxy-phenyl)-s-triazine. These crosslinkers are activated by UV light generated from artificial sources such as medium pressure mercury lamps or a UV blacklight.

The amount and identity of crosslinker, if used, is tailored depending upon the desired application of the adhesive composition. Typically, the crosslinker is present in amounts less than 5 parts based on total dry weight of adhesive composition. Typically, the crosslinker is present in amounts from 0.01 parts to 1 part based on total dry weight of the adhesive composition.

As mentioned above, the adhesive composition may further comprise domains having a higher refractive index than the first elastomeric polymer, where the domains comprise liquids, polymers, additives or particles. These domains, when present are in addition to the low molecular weight polymeric additive. In embodiments in which the domains comprise particles, the particles are thermoplastic polymer particles, at least some of the particles having an average particle size that is larger than the average wavelength of visible light. Suitable thermoplastic materials include polyethylene, and ethylene copolymers such as ethylene/polyolefin copolymers and ethylene/vinyl copolymers such as ethylene vinyl acetate (EVA), ethylene methyl acrylate (EMA), ethylene acrylic acid (EAA), EAA ionomers, and polypropylene, and other thermoplastic materials such as acrylics, polyphenylene ether, polyphenylene sulfide, acrylonitrile-butadiene-styrene copolymer (ABS), polyurethanes, and others know to those skilled in the art. Blends of thermoplastic materials may also be used. Particularly suitable thermoplastic materials are polyethylene and EVA.

The particles may be of a wide range of sizes and shapes, as long as at least some particles have an average particle size that is larger than the wavelength of visible light. Because the particles are formed from the hot melt processing of a shells that have been prepared from films, the sizes, shapes, as well as the range of sizes and shapes can be largely dependent upon the hot melt processing conditions. This will be discussed in greater detail below.

In some embodiments, at least some of the particles are relatively large. The particles can have a variety of shapes, but typically they are longer in one dimension and narrower in the other two dimensions, roughly needle-shaped. In some embodiments, the particles may be 1 micrometer or even longer in the longest dimension. In some embodiments, the particles may be up to 5 micrometers in the longest dimension. Electron microscopy can be used to determine the dimensions of the particles.

As described above, the adhesive compositions of this disclosure comprise an elastomeric polymer, a low molecular weight polymeric additive, and other optional additives. The elastomeric polymer and low molecular weight polymeric additive can be blended by traditional methods known to those skilled in the art. Such methods include mixing, mechanical rolling, hot melt blending, etc. In some embodiments, the elastomeric polymer, the low molecular weight polymeric additive, and any optional additives are mixed in solution. Examples of suitable solvents are described above, and include ethyl acetate, acetone, methyl ethyl ketone, heptane, toluene and mixtures thereof.

The relative amounts of elastomeric polymer and low molecular weight polymeric additive present in the adhesive composition can be varied to provide the desired properties for the adhesive composition. In some embodiments, 50 to 99 parts by weight per 100 parts by weight of the total dry adhesive composition comprises the elastomeric polymer. More typically, 75 to 99 parts by weight per 100 parts by weight of the total dry adhesive composition comprises the elastomeric polymer. In some embodiments, 85 to 99 parts by weight per 100 parts by weight of the total dry adhesive composition comprises the elastomeric polymer. In some embodiments, it may be desirable to include up to 95 parts by weight per 100 parts by weight of the total dry adhesive composition, such as 50 to 95, or 75 to 95, or even 85 to 95 parts by weight per 100 parts total dry adhesive composition. In some specific embodiments, 90 parts by weight per 100 parts by weight of the total dry adhesive composition comprises the elastomeric polymer.

In some embodiments, the adhesive composition comprises 1 to 50 parts by weight per 100 parts by weight of the total dry adhesive composition of the low molecular weight polymeric additive. More typically, the adhesive composition comprises 1 to 25 parts by weight per 100 parts by weight of the total dry adhesive composition of the low molecular weight polymeric additive, or even 1 to 15 parts by weight per 100 parts by weight of the total dry adhesive composition of the low molecular weight polymeric additive. In some embodiments, it may be desirable to include at least 5 parts by weight per 100 parts by weight of the total dry adhesive composition, such as 5 to 50, or 5 to 25, or even 5 to 15 parts by weight per 100 parts total dry adhesive composition. In some specific embodiments, 10 parts by weight per 100 parts by weight of the total dry adhesive composition comprises the low molecular weight polymeric additive.

In some embodiments, the adhesive composition is prepared by hot melt processing. In some specific embodiments of hot melt processing, the elastomeric polymer or a combination of the elastomeric polymer with other components are supplied in a polymeric shell. The elastomeric polymer in a polymeric shell is hot melt blended with the low molecular weight polymeric additive. Optional additional additives can also be blended into the composition, either by being included with the elastomeric polymer in the polymeric shell, or by adding the optional additives separately. Methods of preparing hot melt processable elastomeric polymers in a polymeric shell are described in detail above.

A variety of hot melt mixing techniques using a variety of hot melt mixing equipment are suitable for processing the adhesive compositions which contain elastomeric polymers in polymeric shells. Both batch and continuous mixing equipment may be used. Examples of batch methods include those using a BRABENDER (e.g. a BRABENDER PREP CENTER, commercially available from C.W. Brabender Instruments, Inc.; South Hackensack, N.J.) or BANBURY internal mixing and roll milling equipment (e.g. equipment available from Farrel Co.; Ansonia, CN). Examples of continuous methods include single screw extruding, twin screw extruding, disk extruding, reciprocating single screw extruding, and pin barrel single screw extruding. Continuous methods can utilize distributive elements, pin mixing elements, static mixing elements, and dispersive elements such as MADDOCK mixing elements and SAXTON mixing elements. A single hot melt mixing apparatus may be used, or a combination of hot melt mixing equipment may be used to process the adhesive compositions of this disclosure. For example, one extruder can be used to process the elastomeric polymers contained in polymeric shells, and the output from this extruder can be fed into another extruder for mixing with the low molecular weight polymeric additive and any optional other additives.

The low molecular weight polymeric additive and any optional additional additives can be added at any time during the hot melt processing of the packaged elastomeric polymer or adhesive composition. The resulting adhesive composition comprises an elastomeric polymer, a low molecular weight polymeric additive, where the elastomeric polymer and the low molecular weight polymeric additive form an acid-base interaction. Additionally, the adhesive composition includes any additives added either to the elastomeric polymer contained in a shell, and thermoplastic particles resulting from the hot melt processing of the thermoplastic shell material. These particles have been described above.

Typically, the adhesive composition is optically transparent, and in some embodiments may be optically clear. Optical clarity can be measured in the number of different ways, as will be appreciated by the skilled artisan, but for the purposes of this disclosure optical clarity can be observed visually and optionally measured according to ASTM-D 1003-95. These optically transparent compositions typically have a visible light transmission of greater than 85%. In some embodiments that optically transparent compositions have a visible light transmission of greater than 90%. In addition, these optically transparent compositions typically have a haze value of less than 10%, and in some embodiments less than 5%.

Besides being optically transparent or optically clear, the adhesive composition also has a refractive index that is higher than the refractive index of the elastomeric polymer. Typically, the refractive index of the adhesive composition is in the range of 1.45-1.50. Higher refractive indices are desirable for the adhesive composition to better match the refractive index of optical substrates.

One of skill in the adhesive arts might expect that the addition of a low molecular weight additive, such as is present in the compositions of the present disclosure, would adversely affect the adhesive properties of the composition, particularly the peel strength and shear holding power. Such detrimental effects are often seen with the use of low molecular weight additives. An additional advantage of the adhesive compositions of this disclosure is that the low molecular weight polymeric additive and the elastomeric polymer form an acid-base interaction. While not wishing to be bound by theory, it is believed that this interaction permits the low molecular weight polymeric additive and the elastomeric polymer to behave as a single polymer under ambient conditions, instead of as separate components. This mitigates the potential negative impact of the low molecular weight additive on the adhesive properties.

EXAMPLES (Meth)acrylate pressure sensitive adhesives with various amounts of low molecular weight polymeric additives were made and tested. The low molecular weight polymeric additive was prepared from (meth)acrylate monomers including some monomers with a high refractive index. The low molecular weight polymeric additive was mixed elastomeric (meth)acrylate polymers in order to give pressure sensitive adhesives with modified optical properties, adhesion force, and cohesive strength as shown in the following examples.

These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company, Milwaukee, Wis. unless otherwise noted. The following abbreviations are used herein: cm=centimeters; min=minutes; N=Newtons; m=meters; mm=millimeters; Da=Daltons; kPa=kiloPascals.

Materials:

| Abbreviation | Description |
| --- | --- |
| Film 1 | Primed Polyester film, 51 micrometers thick, commercially available from Mitsubishi Polyester Film Inc., Greer, SC as "HOSTAPHAN" |
| M1 | Monomer, Isooctyl acrylate, commercially available from CPS Chemical Co., Old Bridge, NJ. |
| M2 | Monomer, Acrylic acid, commercially available from BASF Corporation, Pasippany, NJ |
| M3 | Monomer, 2-biphenyloxyethyl acrylate, commercially available from Toagosei Co., Ltd., Tokyo, Japan |
| M4 | Monomer, Methyl Acrylate, commercially available from BASF Corporation, Pasippany, NJ |
| M5 | Monomer, Acrylamide, commercially available from BASF Corporation, Pasippany, NJ |
| CTA | Chain Transfer Agent, Isooctylthioglycolate, commercially available from Ciba/BASF, Hawthorne, NY |
| PI | Photoinitiator, commercially available from Ciba/BASF, Hawthorne, NY as "IRGACURE 651" |
| ANOX1 | Antioxidant, commercially available from BASF Corporation, Pasippany, NJ as "IRGANOX 1010" |
| ANOX2 | Antioxidant, commercially available from BASF Corporation, Pasippany, NJ as "IRGANOX 1076" |
| INT1 | Initiator, commercially available from E. I. du Pont Nemours and Company, Wilmington, DE as "VAZO 88" |
| INT2 | Initiator, commercially available from E. I. du Pont Nemours and Company, Wilmington, DE as "VAZO 52" |
| INT3 | Initiator, commercially available from Sigma Aldrich, St. Louis, MO as "LUPERSOL 101" |
| INT4 | Initiator, commercially available from Sigma Aldrich, St. Louis, MO as "LUPERSOL 130" |
| INH1 | Inhibitor, Hydroquinone Monomethyl Ether, commercially available from AMSYN Inc. Stanford, CT as "MEHQ" |
| M6 | Monomer, 2-Ethylhexyl acrylate, commercially available from BASF Corporation, Pasippany, NJ as "2-EHA" |

Test Methods

Refractive Index

Refractive Index was measured using a Metricon 2010/M Prism Coupler (available from Metricon Corporation, Pennington, N.J.).

Luminous Transmission, Clarity, and Haze

Luminous transmission, clarity, and haze were measured according to ASTM D1003-00 using a Gardner Haze-Guard Plus model 4725 (available from BYK-Gardner Columbia, Md.) or a spectrophotometer, Gardner BYK Color TCS Plus model 8870 (available from BYK Gardner, Columbia, Md.). Adhesive samples were laminated onto a single glass slide and measured.

Peel Adhesion Force

Peel adhesion is the force required to remove a coated flexible sheet material from a test panel measured at a specific angle and rate of removal. Peel adhesion was measured using modifications of ASTM method D 3330 (1992) and Pressure Sensitive Tape Council method PSTC-101 (1989). At least one day prior to testing samples, samples were exposed to a constant temperature and humidity, 23° C. and 50% relative humidity. The samples were cut into 25.4 millimeter wide strips. A solvent wash was used to clean glass testing panels prior to testing. The adhesive strips were applied to the glass panels using a roller. Peel adhesion was measured about 10 minutes after application as a 180 degree peel back at a crosshead speed of 30 cm/min using IMASS 2100 Slip/Peel Tester (IMASS, INC., Accord, Mass.). The peel adhesion was measured in ounces per inch and was converted to Newtons/meter (N/m).

Shear Holding Power

The shear holding power tests (sometimes called static shear tests) conducted are modifications of ASTM method D 6463-06 (2012). The samples were equilibrated 24 hours prior to testing at a constant temperature, 23° C., and relative humidity of 50%. 10.2 cm×1.3 cm wide samples were slit and laminated onto stainless steel panels. Film was trimmed away from the stainless steel, so an area of 12 mm×12 mm of the adhesive was adhered to the substrate. A load of 500 grams was hung from the bottom tail of the sample. The samples were tested at room temperature. The time in minutes until failure (when the adhesive splits from the panel) were recorded and are reported.

Synthesis Examples

Elastomeric Polymer Formation

Elastomeric polymer compositions (which themselves are pressure sensitive adhesives) were prepared either by hot melt or solution polymerization.

Hot Melt

The elastomeric polymer compositions (which themselves are pressure sensitive adhesives) in the following table were prepared in polymeric shells as described in U.S. Pat. No. 6,294,249. Photoinitiator, chain transfer agent, and antioxidant were also added.

Hot Melt Formulation Table

| Formulation | Components (parts by weight) |
|---|---|
| F1 | M1/M2 (95/5) + 0.15 PI + 0.03 CTA + 0.2 ANOX2 |
| F2 | M1/M2/M3 (80/5/15) + 0.15 PI + 0.03 CTA + 0.2 ANOX2 |

Solution Polymerization

The following adhesive polymer was prepared through solution polymerization in ethyl acetate.

Solution Polymerized Formulation Table

| Formulation | Components (parts by weight) |
|---|---|
| F3 | M1/M4/M2 (57.5/35/7.5) |

Polymeric Additive Formation

The following polymer additives were synthesized using standard thermal free radical polymerization methods with the two-step adiabatic polymerizations described below. The molecular weight average of the additive ranged between $8.0 \times 10^4$ to $2.5 \times 10^5$ Da. Photoinitiator, antioxidant, chain transfer agent, and an inhibitor were also added (see below).

Additive Formulation Table

| Formulation | Components (parts by weight) |
|---|---|
| F4 | M1/M5 (95/5) |
| F5 | M1/M5/M3 (45/5/50) |
| F6 | M1/M5/M3 (45/5/50) |
| F7 | M1/M5/M3 (70/5/25) |

Formulation 4, F4

A solution was prepared by stirring 92.28 grams isooctyl acrylate (M1), 5.0 grams acrylamide (M5), 0.10 gram ANOX1 antioxidant, 1.70 grams of 5.88 weight percent isooctylthioglycolate (CTA) in M1, and 0.82 gram of 2.44 weight percent INH1 in M6 within an 250 ml glass jar and heating to 65° C. The solution was cooled to 50° C. A mixture of 0.32 gram of 0.25 weight percent solids INT2 in M1 was added and mixed. Then 80 grams of the mixture was transferred to a stainless steel reactor (VSP2 adiabatic reaction apparatus equipped with a 316 stainless steel can that can be obtained from Fauske and Associated Inc., Burr Ridge, Ill.). The reactor was purged of oxygen while heating and pressurized with 414 kPa of nitrogen gas before reaching the induction temperature of 63° C. The polymerization reaction proceeded under adiabatic conditions to a peak reaction temperature of 128° C. A 5.0-gram aliquot was taken from the reaction mixture and the unreacted monomer was 61.75 weight percent based on the total weight of the mixture.

A solution was prepared by mixing 2.50 grams CTA, 1.0 gram INT2 initiator, 0.10 gram INT1 initiator, 0.05 gram INT3 peroxide, 0.15 gram INT4 peroxide, and 46.20 grams ethyl acetate in a 125 ml glass jar. The mixture was shaken on a reciprocating mixer to dissolve the solids. Then, 0.7 gram of the solution was stirred into the stainless steel reactor. The reactor was purged of oxygen while heating and then pressurized with 414 kPa of nitrogen gas before reaching the induction temperature of 59° C. The polymerization reaction proceeded under adiabatic conditions to a peak reaction temperature of 156° C. The mixture was isothermally held at that temperature for 30 minutes and then drained into an 250 ml glass jar. A sample was taken and the unreacted monomer was 4.24 weight percent based on the total weight of the mixture.

Formulation 5, F5

A solution was prepared by stirring 43.32 grams M1, 50.0 grams 2-biphenyloxyethyl acrylate (M3), 5.0 grams M5, 0.10 gram ANOX1 antioxidant, 0.85 grams of 5.88 weight percent CTA in M1, and 0.82 gram of 2.44 weight percent INH1 in M6 within an 250 ml glass jar and heating to 65° C. The solution was cooled to 50° C. A mixture of 0.08 gram of 1.0 weight percent solids INT2 in M1 was added and mixed. Then, 80 grams of the mixture was transferred to the stainless steel reactor described above (in F4). The reactor was purged of oxygen while heating and pressurized with 414 kPa of nitrogen gas before reaching the induction temperature of 63° C. The polymerization reaction proceeded under adiabatic conditions to a peak reaction temperature of 144° C. A 5.0-gram aliquot was taken from the reaction mixture and the unreacted monomer was 25.20 weight percent based on the total weight of the mixture.

A solution was prepared by mixing 1.0 gram INT2 initiator, 0.10 gram INT1 initiator, 0.05 gram INT3 peroxide, 0.15 gram INT4 peroxide, and 48.70 grams ethyl acetate and in a 125 ml glass jar. The mixture was shaken on a reciprocating mixer to dissolve the solids. Then, 0.7 gram of the solution and 0.28 grams of 5.88 weight percent CTA in M1 was stirred into the stainless steel reactor. The reactor was purged of oxygen while heating and then pressurized with 414 kPa of nitrogen gas before reaching the induction temperature of 59° C. The polymerization reaction proceeded under adiabatic conditions to a peak reaction temperature of 144° C. The mixture was isothermally held at that temperature for 30 minutes and then drained into an 250 ml glass jar.

Formulation 6, F6

A solution was prepared by stirring 40.92 grams M1, 50.0 grams M3, 5.0 grams M5, 0.10 gram ANOX1 antioxidant, 3.40 grams of 5.88 weight percent CTA in M1, and 0.82 gram of 2.44 weight percent INH1 in M6 and 5.0 grams isopropyl alcohol (IPA) within an 250 ml glass jar and heating to 65° C. The solution was cooled to 50° C. A mixture of 0.08 gram of 1.0 weight percent solids INT2 in M1 was added and mixed. Then, 80 grams of the mixture was transferred to the stainless steel reactor described above (in F4). The reactor was purged of oxygen while heating and pressurized with 414 kPa of nitrogen gas before reaching the induction temperature of 63° C. The polymerization reaction proceeded under adiabatic conditions to a peak reaction temperature of 116° C. A 5.0-gram aliquot was taken from the reaction mixture and the unreacted monomer was 38.13 weight percent based on the total weight of the mixture.

A solution was prepared by mixing 1.0 gram INT2 initiator, 0.10 gram INT1 initiator, 0.05 gram INT3 peroxide, 0.15 gram INT4 peroxide, and 48.70 grams ethyl acetate and in a 125 ml glass jar. The mixture was shaken on a reciprocating mixer to dissolve the solids. Then, 0.7 gram of the solution and 1.13 grams of 5.88 weight percent CTA in M1 was stirred into the stainless steel reactor. The reactor was purged of oxygen while heating and then pressurized with 414 kPa of nitrogen gas before reaching the induction temperature of 59° C. The polymerization reaction proceeded under adiabatic conditions to a peak reaction temperature of 145° C. The mixture was isothermally held at that temperature for 30 minutes and then drained into an 250 ml glass jar.

Formulation 7, F7

A solution was prepared by stirring 67.44 grams M1, 25.0 grams M3, 5.0 grams M5, 0.10 gram ANOX1 antioxidant, 1.70 grams of 5.88 weight percent CTA in M1, and 0.82 gram of 2.44 weight percent INH1 in M6 and 5.0 grams IPA within an 250 ml glass jar and heating to 65° C. The solution was cooled to 50° C. A mixture of 0.16 gram of 1.0 weight percent solids INT2 in M1 was added and mixed. Then, 80 grams of the mixture was transferred to the stainless steel reactor described above (in F4). The reactor was purged of oxygen while heating and pressurized with 414 kPa of nitrogen gas before reaching the induction temperature of 63° C. The polymerization reaction proceeded under adiabatic conditions to a peak reaction temperature of 123° C. A 5.0-gram aliquot was taken from the reaction mixture and the unreacted monomer was 50.63 weight percent based on the total weight of the mixture.

A solution was prepared by mixing 1.0 gram INT2 initiator, 0.10 gram INT1 initiator, 0.05 gram INT3 peroxide, 0.15 gram INT4 peroxide, and 48.70 grams ethyl acetate and in a 125 ml glass jar. The mixture was shaken on a reciprocating mixer to dissolve the solids. Then, 0.7 gram of the solution and 0.57 grams of 5.88 weight percent CTA in M1 was stirred into the stainless steel reactor. The reactor was purged of oxygen while heating and then pressurized with 414 kPa of nitrogen gas before reaching the induction temperature of 59° C. The polymerization reaction proceeded under adiabatic conditions to a peak reaction temperature of 158° C. The mixture was isothermally held at that temperature for 30 minutes and then drained into an 250 ml glass jar. A sample was taken and the unreacted monomer was 4.16 weight percent based on the total weight of the mixture.

Adhesive Examples

Adhesive samples were prepared by mixing the hot melt elastomeric polymers with a polymeric additive during extrusion, or by mixing the solution polymerized elastomeric polymers with a polymeric additive in solution.

Examples E1-E5, and Comparative Example C1 were hot melt processed and coated as described in U.S. Pat. No. 6,294,249 (see Table 1) at approximately 50 micrometers thick and tested according to the test procedures described above for Transmission, Haze, Refractive Index, Peel Adhesion Force, and Shear Holding Power. The results are shown in the Table 2.

TABLE 1

Hot Melt Elastomeric Polymers with Additives

| Example # | Elastomeric Polymer | Additive | % Additive by weight in Adhesive |
|---|---|---|---|
| C1 | F1 | 0 | 0% |
| E1 | F1 | F5 | 10% |
| E2 | F1 | F6 | 10% |
| E3 | F1 | F7 | 10% |
| E4 | F2 | F7 | 10% |
| E5 | F2 | F4 | 10% |

TABLE 2

Hot Melt Elastomeric Polymer with Additives - Results

| Example # | Refractive Index | % Haze | % Transmission | Peel (N/m) | Shear (min) |
|---|---|---|---|---|---|
| C1 | 1.4689 | 23.6 | 93.4 | 537.0 | 3 |
| E1 | 1.4808 | 5.0 | 91.1 | 329.3 | 13 |
| E2 | 14916 | 9.3 | 90.5 | 451.0 | 12 |
| E3 | 1.4938 | 10.1 | 90.5 | 501.1 | 11 |
| E4 | 1.4992 | 7.3 | 90.9 | 435.1 | 11 |
| E5 | 1.4947 | 8.0 | 91 | 512.0 | 32 |

For Examples E6-E9 and Comparative Example C2, solution polymerized elastomeric polymer was combined with additive F5 and solvent coated at approximately 50 micrometers and tested according to the test procedures described above for Transmission, Clarity, Haze, and Refractive Index. Adhesive samples were laminated and measured between two pieces of Film 1. The results are shown in the Table 3.

TABLE 3

Solution Polymerized Elastomeric Polymers with Additives

| Example # | Elastomeric Polymer | % Additive by weight in Adhesive Polymer | % Transmission | % Haze | % Clarity | Refractive Index |
|---|---|---|---|---|---|---|
| C2 | F3 | 0 | 87.3 | 4 | 99.2 | 1.4739 |
| E6 | F3 | 5 | 88.2 | 3.9 | 98.4 | 1.4739 |

TABLE 3-continued

Solution Polymerized Elastomeric Polymers with Additives

| Example # | Elastomeric Polymer | % Additive by weight in Adhesive Polymer | % Transmission | % Haze | % Clarity | Refractive Index |
|---|---|---|---|---|---|---|
| E7 | F3 | 10 | 87.4 | 3.9 | 99.2 | 1.4781 |
| E8 | F3 | 20 | 87.6 | 3.5 | 99.2 | 1.4878 |
| E9 | F3 | 40 | 87.7 | 4.1 | 99.2 | 1.4984 |

What is claimed is:

1. An adhesive composition comprising:
   a thermoplastic polymeric shell;
   a first elastomeric polymer prepared in the thermoplastic polymeric shell; and
   a low molecular weight polymeric additive, wherein the first elastomeric polymer and the low molecular weight polymeric additive form an acid-base interaction, and wherein the refractive index of the adhesive composition is higher than the refractive index of the first elastomeric polymer, wherein the adhesive composition is hot melt processable, and wherein the first elastomeric polymer and the low molecular weight polymeric additive upon forming the acid-base interaction is a composition having a refractive index that approximates the refractive index of the thermoplastic polymeric shell, and wherein the refractive index of the adhesive composition is in the range of 1.45-1.50.

2. The adhesive composition of claim 1, wherein the adhesive composition comprises a pressure sensitive adhesive.

3. The adhesive composition of claim 1, wherein the adhesive composition is optically transparent.

4. The adhesive composition of claim 1, where the adhesive composition is optically clear, having a visible light transmission of greater than 90%, and a haze of less than 5%.

5. The adhesive composition of claim 1, wherein the adhesive composition further comprises domains having a higher refractive index than the first elastomeric polymer, wherein the domains comprise liquids, polymers, additives or particles.

6. The adhesive composition of claim 5, wherein the domains comprise particles of a thermoplastic polymer, at least some of the particles having an average particle size that is larger than the wavelengths of visible light, where the wavelengths of visible light are 400-700 nanometers, that is, the average particle size is larger than 400 nanometers, and where the adhesive composition is optically clear, having a visible light transmission of greater than 90%, and a haze of less than 5%.

7. The adhesive composition of claim 6, wherein the particles of thermoplastic polymer comprise particles of polyethylene, ethylene vinyl acetate, ethylene methyl acrylate, ethylene acrylic acid, ethylene acrylic acid ionomers, polypropylene, acrylic polymers, polyphenylene ether, polyphenylene sulfide, acrylonitrile-butadiene-styrene copolymers, polyurethanes, and mixtures and blends thereof.

8. The adhesive composition of claim 1, wherein the low molecular weight polymeric additive comprises a copolymer prepared from ethylenically unsaturated monomers, the ethylenically unsaturated monomers comprising aromatic monomers, and monomers with acidic functionality or basic functionality, wherein at least one of the aromatic monomers has the formula:

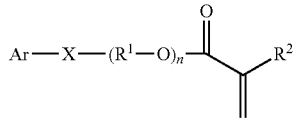

wherein:
Ar is an aromatic group which is unsubstituted or substituted with a substituent selected from the group consisting of $Br_y$ and $(R^3)_z$ wherein y represents the number of bromine substituents attached to the aromatic group and is an integer from 0 to 3; $R^3$ is a straight or branched alkyl of 2 to 12 carbons; and z represents the number of $R^3$ substituents attached to the aromatic ring and is an integer from 0 to 1, provided that both y and z are not zero;
X is oxygen, sulfur or $-NR^4-$, wherein $R^4$ is H or $C_1$-$C_4$ alkyl;
n is 0 to 3;
$R^1$ is an unsubstituted straight or branched alkyl linking group of 2 to 12 carbons;
and
$R^2$ is either H or $CH_3$.

9. The adhesive composition of claim 8, wherein the low molecular weight polymeric additive comprises a (meth) acrylate copolymer comprising a copolymer of an aromatic monomer in an amount of at least 5 parts by weight per 100 parts by weight of total monomer, the aromatic monomer having the formula:

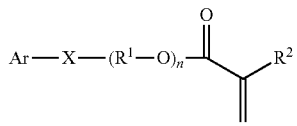

wherein:
Ar is an aromatic group which is unsubstituted or substituted with a substituent selected from the group consisting of $Br_y$ and $(R^3)_z$ wherein y represents the number of bromine substituents attached to the aromatic group and is an integer from 0 to 3; $R^3$ is a straight or branched alkyl of 2 to 12 carbons; and z represents the number of $R^3$ substituents attached to the aromatic ring and is an integer from 0 to 1, provided that both y and z are not zero;
X is oxygen, sulfur or $-NR^4-$, wherein $R^4$ is H or $C_1$-$C_4$ alkyl;
n is 0 to 3;
$R^1$ is an unsubstituted straight or branched alkyl linking group of 2 to 12 carbons;
and
$R^2$ is either H or $CH_3$.

10. The adhesive composition of claim 9, wherein the aromatic monomer(s) are selected from the group consisting of 6-(4,6-dibromo-2-isopropyl phenoxy)-1-hexyl acrylate, 6-(4,6-dibromo-2-sec-butyl phenoxy)-1-hexyl acrylate, 2,6-dibromo-4-nonylphenyl acrylate, 2,6-dibromo-4-dodecyl phenyl acrylate, 2-(1-naphthyloxy)-1-ethyl acrylate, 2-(2-naphthyloxy)-1-ethyl acrylate, 6-(1-naphthyloxy)-1-hexyl acrylate, 6-(2-naphthyloxy)-1-hexyl acrylate, 8-(1-naphthyloxy)-1-octyl acrylate, 8-(2-naphthyloxy)-1-octyl acrylate, and phenoxy ethyl acrylate.

11. The adhesive composition of claim 1, wherein the adhesive composition is crosslinked.

* * * * *